(12) United States Patent
Yasuda

(10) Patent No.: US 11,404,963 B2
(45) Date of Patent: Aug. 2, 2022

(54) ELECTRONIC CIRCUIT WITH MINIMIZED VARIATION IN OUTPUT VOLTAGE OF DC-DC CONVERTER, CONTROL SYSTEM WITH ELECTRONIC CIRCUIT AND METHOD FOR CONTROLLING ELECTRONIC CIRCUIT

(71) Applicant: SOCIONEXT INC., Kanagawa (JP)

(72) Inventor: Koichi Yasuda, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 184 days.

(21) Appl. No.: 16/916,971

(22) Filed: Jun. 30, 2020

(65) Prior Publication Data

US 2021/0006161 A1    Jan. 7, 2021

(30) Foreign Application Priority Data

Jul. 4, 2019    (JP) .............................. JP2019-125480

(51) Int. Cl.
| | |
|---|---|
| *H02M 3/158* | (2006.01) |
| *H02M 3/157* | (2006.01) |
| *H03L 7/08* | (2006.01) |
| *H02M 1/00* | (2006.01) |

(52) U.S. Cl.
CPC ........... *H02M 3/158* (2013.01); *H02M 3/157* (2013.01); *H03L 7/08* (2013.01); *H02M 1/0032* (2021.05)

(58) Field of Classification Search
CPC ...... H02M 3/156; H02M 3/157; H02M 3/158; H02M 1/0032; H03L 7/08
See application file for complete search history.

(56) References Cited

U.S. PATENT DOCUMENTS

| | | | | |
|---|---|---|---|---|
| 2009/0224838 | A1* | 9/2009 | Schlueter | H03L 7/1075 331/17 |
| 2015/0277460 | A1* | 10/2015 | Liu | G05F 1/56 323/280 |
| 2015/0326123 | A1* | 11/2015 | Fukushima | H02M 3/156 323/271 |
| 2019/0103801 | A1* | 4/2019 | Venkataraman | H02M 3/158 |

FOREIGN PATENT DOCUMENTS

| | | |
|---|---|---|
| JP | 2004-032875 A | 1/2004 |
| JP | 2009-165283 A | 7/2009 |

* cited by examiner

*Primary Examiner* — Alex Torres-Rivera
(74) *Attorney, Agent, or Firm* — McDermott Will & Emery LLP

(57) ABSTRACT

An electronic circuit to which DC power is supplied, by a DC-DC converter is provided. The electronic circuit includes at least one PLL circuit configured to synchronize a phase of an output signal of the PLL circuit with a phase of a clock signa; at least one logic circuit configured to operate according to the output signal; and a control circuit configured to output a control signal for switching an operation mode of the DC-DC converter from a PFM mode to a PWM mode, upon detecting that the clock signal is input to the PLL circuit.

15 Claims, 5 Drawing Sheets

FIG.2

| | CLK A 1000 MHz (HIGH SPEED MODE) | CLK A' 200 MHz (LOW SPEED MODE) | CLK B | CLK C | CLKS A to C TOTAL CONSUMPTION POWER OF LOGICS | OPERATION STATE OF DC-DC CONVERTER (INITIAL STATE IS STANDBY STATE OF 0 W) |
|---|---|---|---|---|---|---|
| ESTIMATED CONSUMPTION POWER OF LOGIC | 0.6 W | 0.1 W | 0.25 W | 0.15 W | 1.1 W | |
| ACTIVATION PATTERN #1 | ○ | — | ○ | ○ | 1.0 W | PFM ⇒ PWM |
| ACTIVATION PATTERN #2 | ○ | — | — | — | 0.6 W | PFM ⇒ PWM |
| ACTIVATION PATTERN #3 | — | ○ | ○ | ○ | 0.5 W | PFM ⇒ PWM EXAMPLE 1) THRESHOLD Th1 (0.5 W) VERSION |
| ACTIVATION PATTERN #4 | — | — | ○ | ○ | 0.4 W | MAINTAIN PFM EXAMPLE 2) THRESHOLD Th2 (0.4 W) VERSION |
| ACTIVATION PATTERN #5 | — | ○ | — | ○ | 0.25 W | MAINTAIN PFM |

ELECTRONIC CIRCUIT WITH MINIMIZED VARIATION IN OUTPUT VOLTAGE OF DC-DC CONVERTER, CONTROL SYSTEM WITH ELECTRONIC CIRCUIT AND METHOD FOR CONTROLLING ELECTRONIC CIRCUIT

CROSS-REFERENCE TO RELATED APPLICATION

This application claims priority under 35 U.S.C. § 119 to Japanese Patent Application No. 2019-125480, filed Jul. 4, 2019, the contents of which are incorporated herein by reference in their entirety.

BACKGROUND OF THE INVENTION

1. Field of the Invention

The present disclosure relates to an electronic circuit, a control system, and a method for controlling an electronic circuit.

2. Description of the Related Art

DC (Direct current)-DC converters each of which is used to supply power to an electronic circuit such as an SoC (System on a Chip) may have a function of switching operation modes in accordance with power consumption for the electronic circuit, in order to allow for an operational efficiency. For example, the DC-DC converter is switched to a PFM (Pulse Frequency Modulation) system in which a power conversion efficiency is better at a time of light loading. In contrast, the DC-DC converter is switched to a PWM (Pulse Width Modulation) system allowing for a better power conversion efficiency at a time of heavy loading than the PFM system (see, e.g., Japanese Unexamined Patent Application Nos. 2004-32875 and 2009-165283, which are referred to as Patent documents 1 and 2).

SUMMARY

For the DC-DC converter with load variation, a response in the PFM operation is decreased in comparison to the PWM operation. Thus, for example, when a load current through the electronic circuit to which DC power is supplied, by the DC-DC converter rises rapidly in the PFM operation, the output voltage of the DC-DC converter may drop rapidly.

In view of the issue described above, the present disclosure provides an electronic circuit, a control system, and a method for controlling an electronic circuit whereby it is possible to minimize variation in the output voltage of the DC-DC converter in accordance with load variation.

The present disclosure provides an electronic circuit to which DC power is supplied, by a DC-DC converter; the electronic circuit including: at least one PLL circuit configured to synchronize a phase of an output signal of the PLL circuit with a phase of a clock signal; at least one logic circuit configured to operate according to the output signal; and a control circuit configured to output a control signal for switching an operation mode of the DC-DC converter from a PFM mode to a PWM mode, upon detecting that the clock signal is input to the PLL circuit.

The present disclosure provides a control system including: a DC-DC converter; and an electronic circuit to which DC power is supplied, by the DC-DC converter. The electronic circuit includes at least one PLL circuit configured to synchronize a phase of an output signal of the PLL circuit with a phase of a clock signal; at least one logic circuit configured to operate according to the output signal; and a control circuit configured to output a control signal for switching an operation mode of the DC-DC converter from a PFM mode to a PWM mode, upon detecting that the clock signal is input to the PLL circuit.

The present disclosure provides a method for controlling an electronic circuit to which DC power is supplied, by a DC-DC converter, the electronic circuit including at least one PLL circuit configured to synchronize a phase of an output signal of the PLL circuit with a phase of a clock signal; and at least one logic circuit configured to operate according to the output signal. The method includes detecting that the clock signal is input to the PLL circuit; and outputting a control signal for switching an operation mode of the DC-DC converter from a PFM mode to a PWM mode, upon detecting the input clock signal.

According to the technique in the present disclosure, an electronic circuit, a control system, and a method for controlling an electronic circuit are provided whereby it is possible to minimize variation in the output voltage of the DC-DC converter in accordance with load variation.

BRIEF DESCRIPTION OF THE DRAWINGS

FIG. 2 is a table illustrating an example of input patterns each of which represents the presence or absence of input of each of a plurality of clock signals;

DESCRIPTION OF THE EMBODIMENTS

Figure 1:
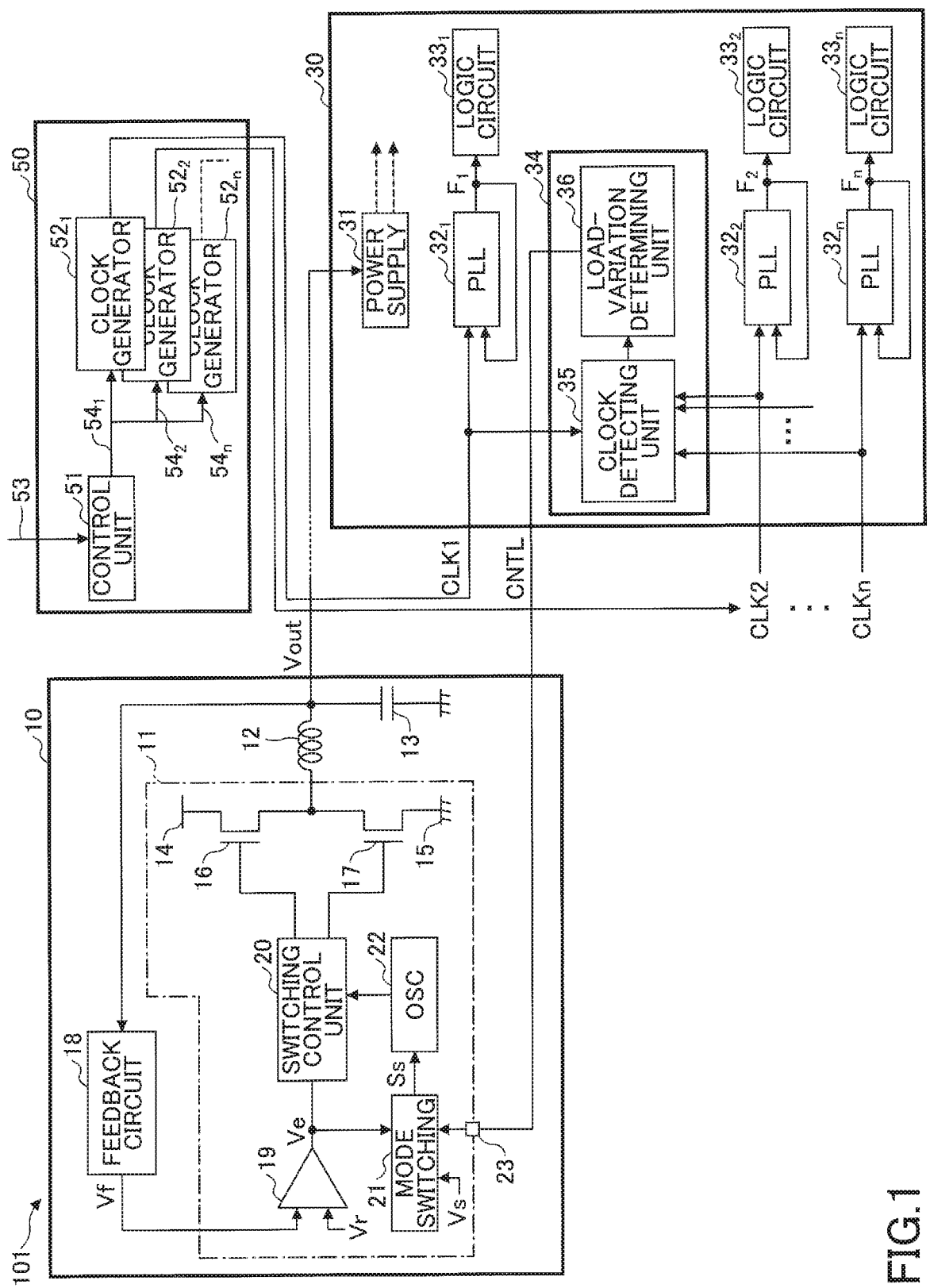
FIG. 1 is a diagram illustrating an example of the configuration of a control system according to a first embodiment.

FIG. 1 is a diagram illustrating an example of the configuration of a control system according to a first embodiment. The control system 101 illustrated in FIG. 1 is provided in an electronic device such as a supercomputer, a server, a personal computer, or a mobile computer. Note that the electronic device that includes the control system 101 is not limited to the device described above.

The control system 101 includes a DC-DC converter 10, an electronic circuit 30, and a system controller 50.

The DC-DC converter 10 is an example of a DC-DC converter that is operable in a PFM mode and a PWM mode. The DC-DC converter 10 is a device that converts DC input power supplied across a high electric potential part 14 and a low electric potential part 15, into DC power associated with an output voltage Vout, and that provides the DC power. More specifically, the DC-DC converter 10 is a switching regulator that operates so that the output voltage Vout converges to a predetermined target voltage. The DC-DC converter 10 includes a power supply IC (Integrated Circuit) 11, an inductor 12, a capacitor 13, and a feedback circuit 18. Note that integrated components are not limited to the components included in the power supply IC 11 illustrated in FIG. 1.

The inductor 12 has one end connected to transistors 16 and 17 of the power supply IC 11; and the other end connected to a power supply 31 of the electronic circuit 30. The capacitor 13 has one end connected to the other end of the inductor 12; and the other end connected to the low electric potential part 15 such as a ground. The output voltage Vout is supplied from an output terminal to which the other end of the inductor 12 and the one end of the capacitor 13 are connected, and the output terminal is connected to a feedback circuit 18. The feedback circuit 18 feeds the output voltage Vout back to the power supply IC 11. For example, the feedback circuit 18 divides the output voltage Vout and supplies the divided voltage to the power supply IC 11, as a feedback output voltage Vf.

The power supply IC 11 is a power control unit that controls a current through the inductor 12 based on the output voltage Vout (feedback output voltage Vf) fed back by the feedback circuit 18, so that the output voltage Vout converges to a predetermined target voltage. The power supply IC 11 includes the high side transistor 16; the low side transistor 17; an error amplifier 19; a mode switching unit 21; an oscillator (OSC) 22; a switching control unit 20; and a mode set terminal 23.

The transistors 16 and 17 are switching elements that are turned on or off in accordance with drive control signals supplied by the switching control unit 20. For example, each of the transistors 16 and 17 is a MOSFET (Metal Oxide Semiconductor Field Effect Transistor). The p-channel transistor 16 includes a source connected to the high electric potential part 14; a drain connected to a drain of the transistor 17; and a gate connected to the switching control unit 20. The n-channel transistor 17 includes a source connected to the low electric potential part 15; the drain connected to the drain of the transistor 16; and a gate connected to the switching control unit 20. The one end of the inductor 12 is connected to a connection node to which the drain of the transistor 16 and the drain of the transistor 17 are connected. The DC input power supply voltage is applied across the high electric potential part 14 and the low electric potential part 15.

The error amplifier 19 supplies an error voltage Ve corresponding to a voltage difference between the feedback output voltage Vf and a predetermined reference voltage Vr. The error amplifier 19 includes, for example, an inverting input terminal to which the feedback output voltage Vf is applied; a non-inverting input terminal to which the predetermined reference voltage Vr is applied; and an output terminal from which the error voltage Ve is supplied. The error voltage Ve is supplied to the mode switching unit 21 and the switching control unit 20.

In the PWM mode in which duty cycles used in switching the transistors 16 and 17 are each adjusted at a certain switching frequency to thereby adjust the output voltage Vout, switching loss increases under a condition of light loading in which the load current is relatively low. Thus, the power conversion efficiency decreases. In contrast, in the PFM mode, because the switching frequency decreases under the condition of light loading in which the load current is relatively low, reduction in the power conversion efficiency due to an increase in the switching loss can be avoided.

In view of the point described above, the mode switching unit 21 includes a function of switching the operation mode of the DC-DC converter 10 to the PWM mode under the condition of heavy loading in which the load current is relatively high, and includes a function of switching the operation mode of the DC-DC converter 10 to the PFM mode under the condition of light loading in which the load current is relatively low. With such a switching function, reduction in the power conversion efficiency can be avoided under the condition of light loading.

When the mode set terminal 23 is at inactive level (for example, low level), in a case where the error voltage Ve is lower than or equal to a predetermined switching voltage Vs, the mode switching unit 21 automatically switches the operation mode of the DC-DC converter 10, from the PWM mode to the PFM mode. Further, when the mode set terminal 23 is at inactive level, in a case where the error voltage Ve is higher than the predetermined switching voltage Vs, the mode switching unit 21 automatically switches the operation mode of the DC-DC converter 10, from the PFM mode to the PWM mode.

In contrast, when the mode set terminal 23 is at active level (for example, at high level), even in a case where the error voltage Ve is lower than or equal to the predetermined switching voltage Vs, the mode switching unit 21 switches the operation mode of the DC-DC converter 10, from the PFM mode to the PWM mode. In other words, when the electronic circuit 30 external to the DC-DC converter 10 sets the mode set terminal 23 to be at active level, the operation mode of the DC-DC converter 10 can be forcibly switched from the PFM mode to the PWM mode.

The mode switching unit 21 outputs a switching signal Ss for setting the operation mode of the DC-DC converter 10 to the PFM mode or the PWM mode. For example, the mode switching unit 21 includes a comparator that includes an inverting input terminal to which the error voltage Ve is applied; a non-inverting input terminal to which the predetermined switching voltage Vs is applied; and an output terminal from which the switching signal Ss indicative of a result of the comparison between the error voltage Ve and the switching voltage Vs is output.

The oscillator 22 outputs a triangular wave signal in accordance with the switching signal Ss output from the mode switching unit 21. When the operation mode of the DC-DC converter 10 is switched to the PWM mode by the mode switching unit 21, the oscillator 22 fixes a frequency of the triangular wave signal to a constant value. When the operation mode of the DC-DC converter 10 is switched to the PFM mode by the mode switching unit 21, the oscillator 22 reduces the frequency of the triangular wave signal, in comparison to the case where the operation mode is switched to the PWM mode. In this case, the oscillator 22 reduces the frequency of the triangular wave signal until the feedback output voltage Vf is identical to the reference voltage Vr.

The switching control unit 20 compares the error voltage Ve output from the error amplifier 19 with the triangular wave signal output from the oscillator 22, and controls switching of the transistors 16 and 17 in accordance with the compared result. Thereby, when the operation mode of the DC-DC converter 10 is set to the PFM mode by the mode switching unit 21, the transistors 16 and 17 are switched by the switching control unit 20 to be driven under a PFM control. In contrast, when the operation mode of the DC-DC converter 10 is set to the PWM mode by the mode switching unit 21, the transistors 16 and 17 are switched by the switching control unit 20 to be driven under a PWM control.

The electronic circuit 30 is a load circuit to which DC power associated with the output voltage Vout is supplied, by the DC-DC converter 10. The electronic circuit 30 is a semiconductor circuit such as an SoC. The electronic circuit 30 includes a power supply 31; a plurality of PLL (Phase Locked Loop) circuits $32_1$ to $32_n$; a plurality of logic circuits $33_1$ to $33_n$; and a control circuit 34.

The power supply 31 is a power supply circuit that converts the output voltage Vout supplied by the DC-DC converter 10, into an internal power supply voltage associated with the electronic circuit 30. The PLL circuits $32_1$ to $32_n$; the logic circuits $33_1$ to $33_n$; and the control circuit 34 each operate according to the internal power supply voltage produced by the power supply 31.

The PLL circuits $32_1$ to $32_n$ each synchronize a phase of a corresponding output signal from among multiple output signals $F_1$ to $F_n$, to a phase of a corresponding clock signal from among multiple clock signals CLK1 to CLKn. For example, the PLL circuit $32_1$ synchronizes the phase of the output signal $F_1$ to the phase of the clock signal CLK1. Similarly, the other PLL circuits $32_2$ to $32_n$ each synchronize the phase of a given output signal to the phase of a given clock signal, as in the case with the PLL circuit $32_1$.

The logic circuits $33_1$ to $33_n$ each operate according to a corresponding output signal from among the output signals $F_1$ to $F_n$. For example, the logic circuit $33_1$ operates according to the output signal $F_1$. Similarly, the other logic circuits $33_2$ to $33_n$ each operate according to a given output signal.

The logic circuit $33_1$ operates in a clock cycle of the output signal $F_1$. When the output signal $F_1$ is input to the logic circuit $33_1$, the logic circuit $33_1$ operates and thus the power consumption for the logic circuit $33_1$ increases. Accordingly, the power consumption for the logic circuit $33_1$ is increased. In contrast, when input of the output signal $F_1$ to the logic circuit $33_1$ is stopped, the logic circuit $33_1$ is stopped and thus the power consumption for the logic circuit $33_1$ is reduced. The other logic circuits $33_2$ to $33_n$ have the same configurations as described in the logic circuit $33_1$.

In other words, when the clock signal CLK1 is input to the PLL circuit $32_1$, the PLL circuit $32_1$ operates and thus the power consumption for the PLL circuit $32_1$ increases. Thereby, the power consumption for the logic circuit $33_1$ corresponding to the PLL circuit $32_1$ is increased. In contrast, when input of the clock signal CLK1 to the PLL circuit $32_1$ is stopped, the PLL circuit $32_1$ is stopped and thus the power consumption for the PLL circuit $32_1$ is decreased. Thereby, the power consumption for the logic circuit $33_1$ corresponding to the PLL circuit $32_1$ is decreased. The other PLL circuits $32_2$ to $32_n$ and the other logic circuits $33_2$ to $33_n$, have the same configurations as described in the PLL circuit $32_1$ and the logic circuit $33_1$. Accordingly, the magnitude of load variation of the electronic circuit 30 is considered to be influenced by the presence or absence of each of the clock signals CLK1 to CLKn that is input to a corresponding PLL circuit from among the PLL circuits $32_1$ to $32_n$.

In light of the point described above, the control circuit 34 outputs a control signal CNTL for switching the operation mode of the DC-DC converter 10, from the PFM mode to the PWM mode, where the mode switching is performed based on the presence or absence of each of the clock signals CLK1 to CLKn that is input to a corresponding PLL circuit from among the PLL circuits $32_1$ to $32_n$; or one or more clock modes for the respective clock signals that are input to the PLL circuits. The clock modes will be described below in detail. When the control signal CNTL at active level (for example, high level) is applied to the mode set terminal 23, the operation mode of the DC-DC converter 10 is switched by the mode switching unit 21 to the PWM mode in which the response to load variation is increased in comparison to the PFM mode. As a result, the number of clock signals that are each input to a corresponding PLL circuit from among the PLL circuits $32_1$ to $32_n$ increases and thus a sharp drop in the output voltage Vout can be avoided, even when the load current through the electronic circuit 30 is increased rapidly.

After the DC-DC converter 10 receives the control signal CNTL, a certain period of time (hereinafter, also referred to as a switching time T) is required to actually switch the operation mode of the DC-DC converter 10 to the PWM mode. Thus, the control circuit 34 preferably outputs the control signal CNTL, before a lapse of a period of lock-up time of a corresponding PLL circuit to which the clock signal is detected to be input, and that is from among the PLL circuits $32_1$ to $32_n$. Thereby, the period of lock-up time of the PLL circuit is set within a part or the entirety of the switching time T. In other words, before one or more logic circuits start with the lapse of the period of lock-up time and thus the power consumption increases, switching to the PWM mode can be performed. Note that the lock-up time refers to time until the frequency of the output signal of a given PLL circuit is fixed to a predetermined frequency (specifically, a frequency of an output signal F that is input to normally operate a given logic circuit at a later stage of the PLL circuit).

After the lapse of the period of lock-up time, each of the logic circuits $33_1$ to $33_n$ may start, wait for a period of waiting time W to pass, and then perform a predetermined operation. More preferably, in order not to perform a predetermined operation before the operation mode of the DC-DC converter 10 is switched to the PWM mode, after the start of each of the logic circuits $33_1$ to $33_n$ with the lapse of the period of lock-up time, each logic circuit may wait for the period of waiting time W to pass, and then perform the predetermined operation. With such a period of waiting time W being set, after a given logic circuit starts according to the output signal F, the predetermined operation at the logic circuit is suspended until the operation mode of the DC-DC converter 10 is switched to the PWM mode. Thereby, before the DC-DC converter 10 is switched to the PWM mode, the increase in the power consumption due to the predetermined operation being performed at each of one or more logic circuits can be avoided.

Alternatively, after the lapse of a period of lock-up time of a corresponding PLL circuit from among the PLL circuits $32_1$ to $32_n$, the PLL circuit may wait for the period of waiting time W to pass, and then output a corresponding output signal from among the output signals $F_1$ to $F_n$. More preferably, in order for a corresponding PLL circuit from among the PLL circuits $32_1$ to $32_n$, not to perform a predetermined operation before the operation mode of the DC-DC converter 10 is switched to the PWM mode, after the lapse of the period of lock-up time of the PLL circuit, the PLL circuit may wait for the period of waiting time W to pass, and then start outputting a corresponding output signal from among the output signals $F_1$ to $F_n$. With such a period of waiting time W being set, the predetermined operation at a given logic circuit is suspended until the operation mode of the DC-DC converter 10 is switched to the PWM mode. Thereby, before the DC-DC converter 10 is switched to the PWM mode, the increase in the power consumption due to the predetermined operation performed at each of one or more logic circuits can be avoided.

The system controller 50 supplies the clock signals CLK1 to CLKn to the electronic circuit 30. The system controller 50 includes a control unit 51 and a plurality of clock generators $52_1$ to $52_n$.

The control unit 51 determines whether one or more clock generators from among the clock generators $52_1$ to $52_n$ should be activated based on an external signal 53 from a device external to the system controller 50. The external signal 53 is a signal that is supplied to the system controller 50 in accordance with a target operation to be performed at the electronic device that includes the control system 101. The control unit 51 outputs one or more corresponding activation signals that are from among activation signals $54_1$ to $54_n$, each activation signal being for activating a given clock generator determined to be activated. For example, the external device that supplies the external signal 53 to the system controller 50 is taken as a sensor or a switch, which is provided in the electronic device with the control system 101.

The clock generators $52_1$ to $52_n$ each supply a clock signal to a corresponding PLL circuit from among the PLL circuits $32_1$ to $32_n$ of the electronic circuit 30, in accordance with a control state of the control unit 51 (in this example, a result of the determination that one or more clock generators should be activated). When receiving, from the control unit 51, a corresponding activation signal from among the activation signals $54_1$ to $54_n$, each determined clock generator among the clock generators $52_1$ to $52_n$ outputs a corresponding clock signal from among the clock signals CLK1 to CLKn. For example, when receiving the activation signal $54_1$ from the control unit 51, the clock generator $52_1$ outputs the clock signal CLK1. The other clock generators $52_2$ to $52_n$ have the same configurations as described in the clock generator CLK1.

The control circuit 34 includes, for example, a clock detecting unit 35 and a load-variation determining unit 36.

The clock detecting unit 35 detects the presence or absence of each of the clock signals CLK1 to CLKn that is input to a corresponding PLL circuit from among the PLL circuits $32_1$ to $32_n$; or one or more clock modes for the respective clock signals that are input to the PLL circuits. The load-variation determining unit 36 estimates load variation of the electronic circuit 30, based on the presence or absence of each of the clock signals CLK1 to CLKn that is detected to be input by the clock detecting unit 35; or the detected clock modes for the respective input clock signals. The load-variation determining unit 36 outputs the control signal CNTL in accordance with the load variation that is estimated based on the presence or absence of each of the clock signals CLK1 to CLKn that is input; or one or more clock modes for the respective input clock signals. Thereby, before load variation of the electronic circuit 30 actually occurs, the operation mode of the DC-DC converter 10 can be switched to the PWM mode.

The load-variation determining unit 36 of the control circuit 34 estimates the magnitude of load variation, based on the presence or absence of each of the clock signals CLK1 to CLKn that is detected to be input by the clock detecting unit 35; or the detected clock modes for the respective input clock signals, and then may derive data corresponding to the magnitude of the load variation. The load-variation determining unit 36 outputs the control signal CNTL in accordance with the derived data. Thereby, the operation mode of the DC-DC converter 10 can be switched to the PWM mode in accordance with the magnitude of the estimated load variation.

For example, the load-variation determining unit 36 derives power consumption data corresponding to the magnitude of the load variation that is estimated based on the presence or absence of each of the clock signals CLK1 to CLKn that is detected to be input by the clock detecting unit 35; or the detected clock modes for the respective input clock signals. When the derived power consumption data is estimated to be greater than a predetermined threshold Th, the load-variation determining unit 36 outputs the control signal CNTL. Thereby, the operation mode of the DC-DC converter 10 can be switched to the PWM mode. In contrast, when the derived power consumption data is estimated to be less than or equal to the predetermined threshold Th, the load-variation determining unit 36 stops outputting the control signal CNTL. Thereby, for the operation mode of the DC-DC converter 10, forcible switching to the PWM mode can be avoided.

FIG. 2 is a table illustrating a plurality of input patterns (activation patterns #1 to #5) each of which represents the presence or absence of each of the clock signals that is input to a given PLL circuit; and clock modes for the respective input clock signals. The power consumption for each of the logic circuits that operates when a corresponding clock signal, from among the clock signals CLK1 to CLKn is input to a given PLL circuit, can be preliminarily calculated by simulation or the like. In FIG. 2, CLK A, CLK A', CLK B, and CLK C each represents any one from among the clock signals CLK1 to CLKn. For example, CLK A represents the clock signal CLK1 in a high speed mode, and CLK A' represents the clock signal CLK1 in a low speed mode. CLK1 represents a clock signal with two clock modes. CLK B represents the clock signal CLK2 and represents a clock signal with one clock mode. In FIG. 2, the "o" indicates that a given clock signal is detected to be input to a given PLL circuit, and the "–" indicates that a given clock signal is not detected to be input to a given PLL circuit.

The load-variation determining unit 36 includes logic circuits that are represented with sets of well-formed logical formulas. For example, when the threshold Th1, which is compared with the total of power consumption data of each logic circuit, is given as Th1 (=0.5 W), in a case where X in the well-formed formula "X=(A·B·C)+A+(A' ·B·C)" becomes 1, the load-variation determining unit 36 outputs the control signal CNTL. In contrast, in a case where X becomes 0, the load-variation determining unit 36 does not output the control signal CNTL. In such a configuration, when a pattern representing the presence or absence of each of the input clock signals matches any one from among the activation patterns #1 to #3, the operation mode of the DC-DC converter 10 can be switched to the PWM mode.

Note that in the well-formed formula, "·" represents a logical conjunction, and "+" represents a logical disjunction. In the well-formed formula, A, A', B, and C are variables to each of which 1 is assigned if the clock signal (in the example in FIG. 2, CLK A, CLK A', CLK B, or CLK C) is input to a given PLL circuit. In each input pattern in FIG. 2, the presence or absence of each of the clock signals that is input to a corresponding PLL circuit from among the PLL circuits, as well as one or more clock modes for respective input clock signals, are represented. However, each input pattern may be a pattern that only represents the presence or absence of each of the clock signals that is input to a corresponding PLL circuit from among the PLL circuits, or be a pattern that only represents one or more clock modes for respective input clock signals.

Figure 3:
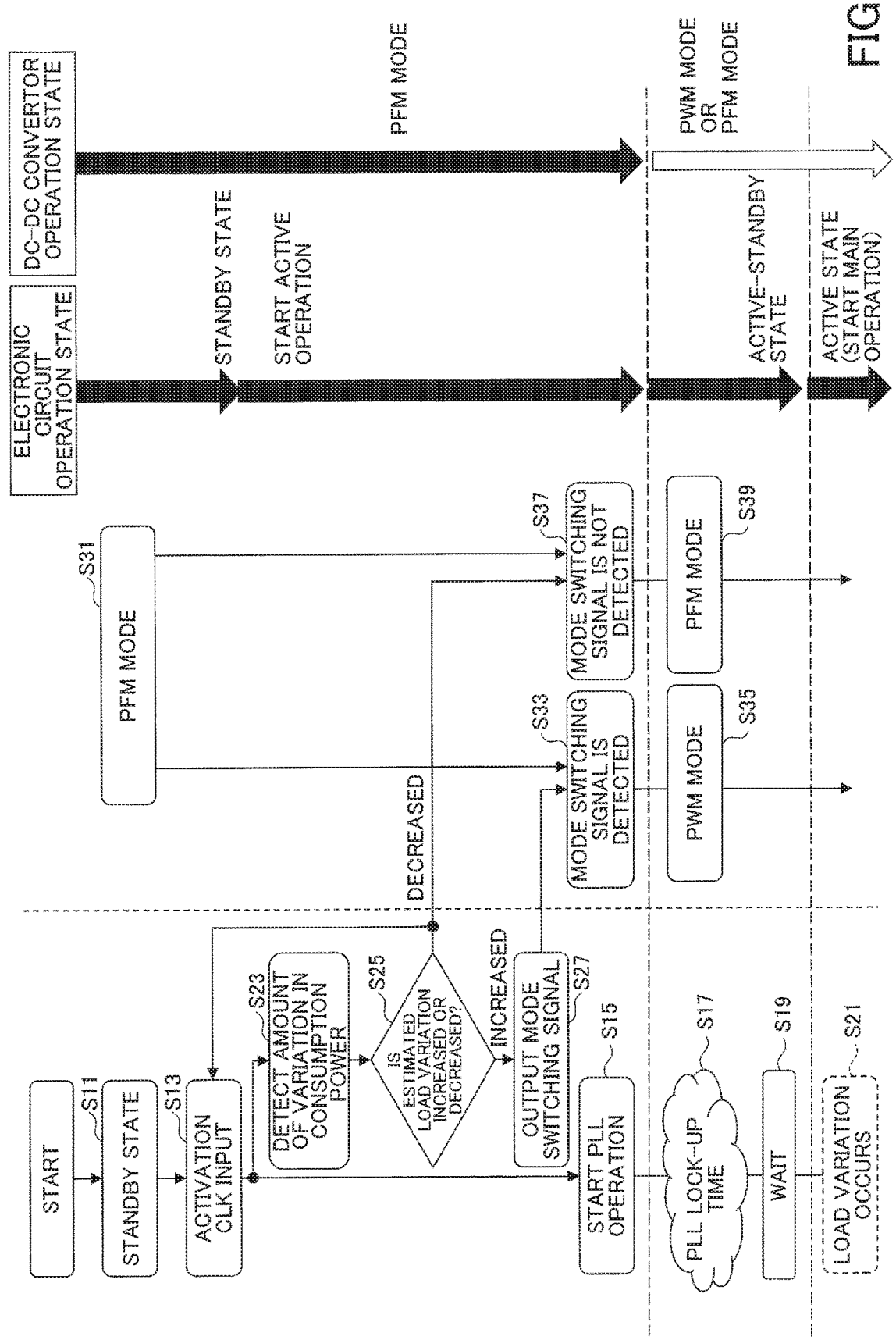
FIG. 3 is a chart illustrating an example of the operation of the control system according to the first embodiment.

FIG. 3 is a flowchart illustrating an example of the operation of the control system according to the first embodiment, and illustrates an example of a method for controlling the electronic circuit 30 in the control system 101 illustrated in FIG. 1.

The electronic circuit 30 is on standby in a standby state (in this case, the operation state of the DC-DC converter is in the PFM mode) in which the DC power associated with the output voltage Vout is supplied, and in which the clock signals CLK1 to CLKn are not input to the respective PLL circuits $32_1$ to $32_n$ (step S11). When inputting the clock signal CLK, at least one PLL circuit from among the PLL circuits $32_1$ to $32_n$ is activated (step S13). With the PLL circuit being activated in response to inputting the clock signal CLK, the PLL circuit starts the PLL operation (step S15).

After a lapse of the period of lock-up time (step S17), at least one from among the logic circuits $33_1$ to $33_n$ waits for the waiting time W to pass (step S19) and then performs a predetermined operation. With the predetermined operation being performed, load variation occurs (step S21). When the lock-up time is shorter than the switching time T, the wait time W is preset such that the switching time T elapses after the lock-up time has elapsed.

In step S23, the control circuit 34 detects the magnitude of load variation of the electronic circuit 30, based on the presence or absence of each of the clock signals CLK1 to CLKn that is input to a corresponding PLL circuit from among the PLL circuits $32_1$ to $32_n$. The control circuit 34 determines whether the magnitude of the load variation is greater than the predetermined threshold Th (step S25). When the magnitude of the load variation is determined to be greater than the predetermined threshold Th, the control circuit 34 outputs the mode switching signal (control signal CNTL) for switching the operation mode of the DC-DC converter 10 to the PWM mode (step S27). When the magnitude of the load variation is determined to be less than or equal to the predetermined threshold Th, the control circuit 34 does not output the mode switching signal (control signal CNTL) for switching the operation mode of the DC-DC converter 10 to the PWM mode.

When the DC-DC converter 10 is operating in the PFM mode (step S31), the mode switching unit 21 of the DC-DC converter 10 monitors the mode switching signal (control signal CNTL) to be applied to the mode set terminal 23. When the mode switching signal is detected to be applied to the mode set terminal 23 (step S33), the mode switching unit 21 switches the operation mode of the DC-DC converter 10, from the PFM mode to the PWM mode (step S35). When the mode switching signal is not detected to be applied to the mode set terminal 23 (step S37), the mode switching unit 21 maintains the PFM mode that is the operation mode of the DC-DC converter 10 (step S39).

As described above, after the control signal CNTL is output from the control circuit 34, the electronic circuit 30 waits for the period of lock-up time of the PLL circuit to pass, and then shifts from an active-standby state to the active state. Before the electronic circuit 30 shifts from the standby state to the active state, the operation mode of the DC-DC converter 10 is switched from the PFM mode to the PWM mode. Thereby, drops in the output voltage Vout caused by the shift to the PWM mode can be suppressed. Note that when the active-standby state is given as a first state, the active state corresponds to a second state in which the power consumption for the electronic circuit is higher than that in the first state.

Figure 4:
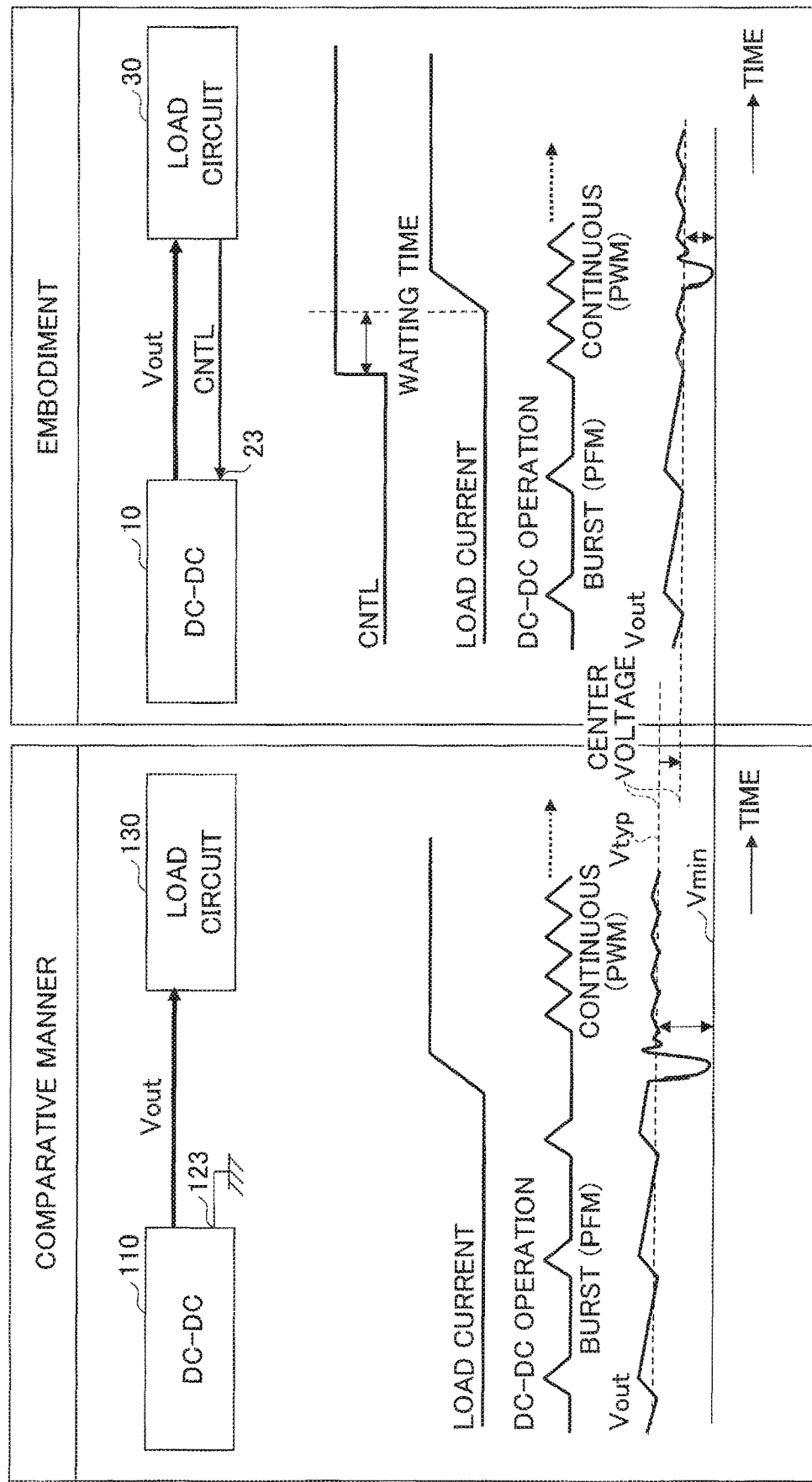
FIG. 4 is a diagram for explaining the comparison between one comparative manner and one embodiment.

FIG. 4 is a diagram for explaining the comparison between one comparative manner and one embodiment.

According to the comparative manner, a mode set terminal 123 of a DC-DC converter 110 is fixed at inactive level (in this example, low level). In this case, when a load current through the electronic circuit 130 that is a load circuit increases, the DC-DC converter 110 automatically switches the operation mode from the PFM mode to the PWM mode.

In this case, according to the comparative manner, when the load current is relatively low, the DC-DC converter 110 operates in the PFM mode. However, when the DC-DC converter 110 is operating in the PFM mode, in a case where the load current sharply increases due to the start of one or more given logic circuits within the electronic circuit 130, the output voltage Vout drops rapidly because the PFM mode results in a decreased response. Thereby, an amount of the decrease in the output voltage Vout increases. Then, after the load current is increased rapidly, the operation mode of the DC-DC converter 110 is switched to the PWM mode.

In contrast, according to one embodiment, the control signal CNTL output from the electronic circuit 30 that is a load circuit is applied to the mode set terminal 23. In this case, when the load current is estimated to increase upon detecting that one or more clock signals are input to the respective PLL circuits, the control signal CNTL is output from the electronic circuit 30. When receiving the control signal CNTL, the DC-DC converter 10 switches the operating mode from the PFM mode to the PWM mode.

Thereby, according to one embodiment, when the control circuit 34 outputs the control signal CNTL, upon detecting the increased number of clock signals that are input to the PLL circuits and detecting the clock modes for the input clock signals, the PFM mode can be switched to the PWM mode before the load current increases due to the start of one or more logic circuits.

In FIG. 4, the voltage Vmin represents a lower limit operating voltage across the electronic circuit 30. According to the comparative manner, when load variation sharply occurs in the PFM mode (burst mode), the amount of the decrease in the output voltage Vout is increased. In contrast, according to one embodiment, the amount of the decrease in the output voltage Vout is reduced because the PFM mode is switched to the PWM mode before the load variation occurs. Thereby, according to one embodiment, because the amount of the decrease in the output voltage Vout is reduced, a center voltage Vtyp for the output voltage Vout can be reduced, so that the electronic circuit 30 can be thereby operated with lower power. Accordingly, the power consumption for the entire control system 101 can be reduced.

In the PFM mode, because the switching frequencies are not constant, a level of the output voltage Vout dropping is not easily analyzed by simulation. For this reason, in consideration of the dropping output voltage Vout, the center voltage Vtyp is needed to be set such that an excess margin of the center voltage Vtyp is taken. In contrast, in the PWM mode, because the switching frequencies are constant, the level of the output voltage Vout dropping can be more accurately estimated by simulation. Thus, the center voltage Vtyp can be set to a more suitable value.

Figure 5:
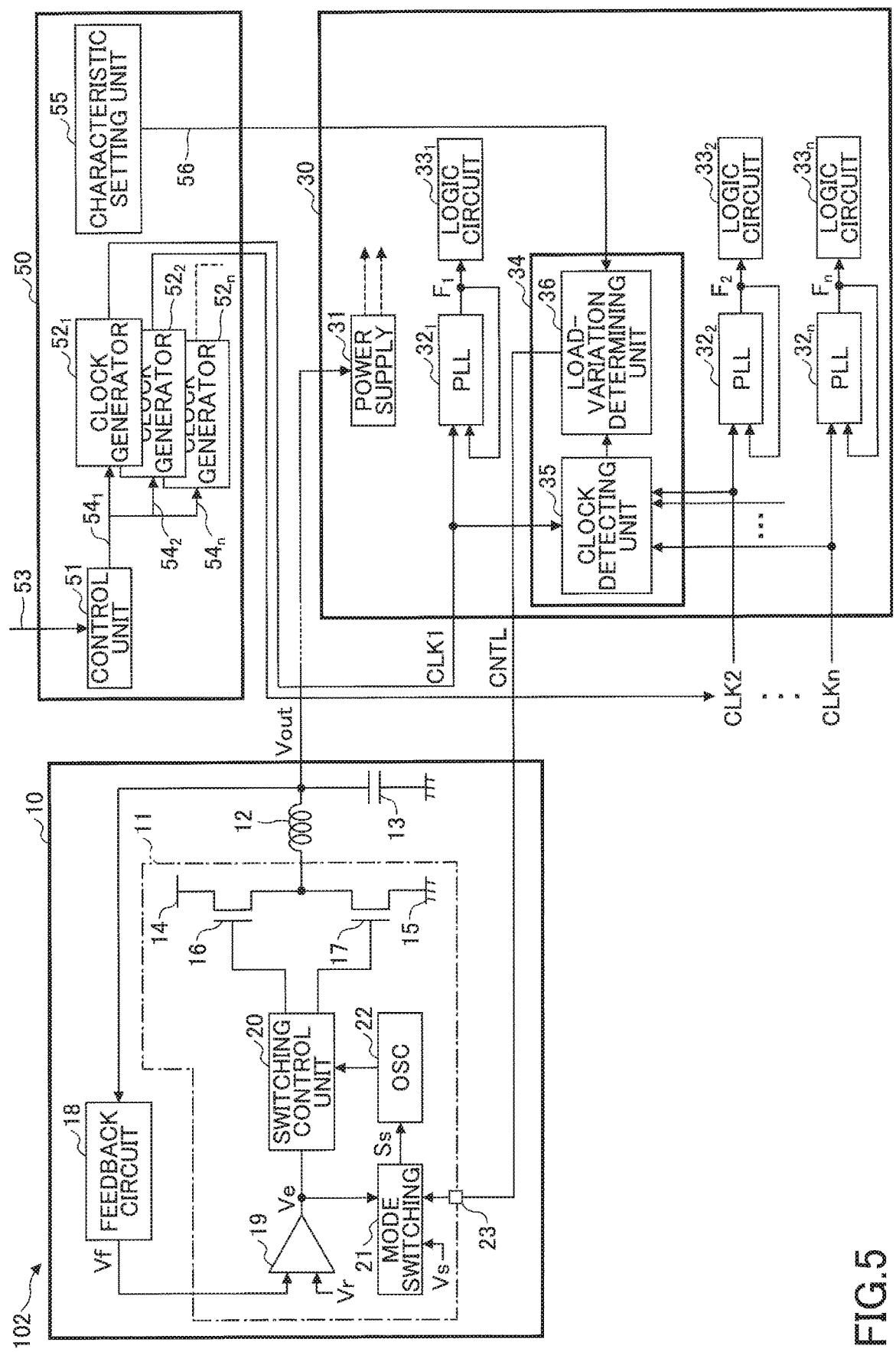
FIG. 5 is a diagram illustrating an example of the configuration of a control system according to a second embodiment.

FIG. 5 is a diagram illustrating an example of the configuration of a control system according to a second embodiment. Explanation for the configuration and effect that are the same as described in the first embodiment will be omitted, or be simplistically provided by reference to the above description. The control system 102 illustrated in FIG. 5 differs from the control system 101 in that the system controller 50 includes a characteristic setting unit 55.

The characteristic setting unit 55 outputs a setting signal 56 for changing one or more input patterns from among the input patterns each of which represents the presence or absence of each of the plurality of clock signals that is input to a given PLL circuit, the one or more input patterns being determined when outputting the control signal CNTL. In accordance with the setting signal supplied by the characteristic setting unit 55, the load-variation determining unit 36 in the control circuit 34 changes one or more input patterns each of which is determined in outputting the control signal CNTL. Thereby, in FIG. 2, for example, the input patterns each of which is determined when outputting the control signal CNTL can be changed from the activation patterns #1 to #3 to the activation patterns #1 to #4. Thus, even when a load response for the DC-DC converter 10 is changed due to a specification change of the DC-DC converter 10, one or more input patterns each of which is determined when outputting the control signal CNTL can be changed to patterns suitable for the changed load response.

For example, the load-variation determining unit 36 in the control circuit 34 sets the threshold Th to a target value that corresponds to the setting signal 56 supplied by the characteristic setting unit 55. For example, in FIG. 2, the threshold Th that is compared with the total of the power consumption data of each logic circuit can be changed from the threshold Th1 (=0.5 W) to a threshold Th2 (=0.4 W). When the threshold Th is set to the threshold Th2 (=0.4 W), in a case where X in the well-formed formula "X=(A·B·C)+A+(A'·B·C)+(B·C)" becomes 1, the load-variation determining unit 36 outputs the control signal CNTL. In contrast, in a case where X becomes 0, the load-variation determining unit 36 does not output the control signal CNTL. As an example, when a pattern representing the presence or absence of each of the clock signals that is input to a given PLL circuit, matches any one from among the activation patterns #1 to #4, the operation mode of the DC-DC converter 10 can be switched to the PWM mode.

The load response for the DC-DC converter 10 can be understood in advance through characteristic data described in a catalog sheet or the like, and thus taking into account the characteristic data, the target value is set by the characteristic setting unit 55. For example, the characteristic setting unit 55 outputs, to the control circuit 34 in the electronic circuit 30, the setting signal 56 that is fixed corresponding to the target value, where the target value is set using a jumper element or a switching element, taking into account the characteristic data. For example, with use of the switching element capable of setting a 4-bit target value, the threshold Th in a 16-level range can be set. In this case, the threshold Th can be set in a 0.32 W range (=0.02 W×16, where 0.02 W indicates increments of the power consumption for a load, and 16 indicates the total number of levels) that is from a lower limit of 0.3 W to an upper limit of 0.62 W. In the PFM mode, the threshold Th is set taking into account the allowable output voltage Vout of the DC-DC converter 10 with load variation.

One or more embodiments have been described using the electronic circuit, the control system, and the method for controlling the electronic circuit. However, the present disclosure is not limited to the embodiments described above. Various modifications or modifications, such as combinations of some or all of the different embodiments; or substitutions therewith, can be made within a scope of the present disclosure.

For example, the system controller 50 may be provided on a chip of the electronic circuit 30. A portion or all of the DC-DC converter 10 may also be provided on a chip of the electronic circuit 30.

What is claimed is:

1. An electronic circuit to which DC power is supplied, by a DC-DC converter; the electronic circuit comprising:
   at least one phase-locked loop (PLL) circuit configured to synchronize a phase of an output signal of the PLL circuit with a phase of a clock signal;
   at least one logic circuit configured to operate according to the output signal; and
   a control circuit configured to output a control signal for switching an operation mode of the DC-DC converter from a pulse frequency modulation (PFM) mode to a pulse width modulation (PWM) mode, upon detecting that the clock signal is input to the PLL circuit.

2. The electronic circuit according to claim 1, wherein the control circuit is configured to output the control signal before a lapse of a period of lock-up time of the PLL circuit.

3. The electronic circuit according to claim 2, wherein, after the period of lock-up time has elapsed, the logic circuit is configured to wait for a period of waiting time to pass, to perform a predetermined operation such that the performed operation is not performed before the operation mode is switched to the PWM mode.

4. The electronic circuit according to claim 1, wherein the at least one PLL circuit is a plurality of PLL circuits, each PLL circuit being configured to synchronize a phase of a corresponding output signal from among a plurality of output signals of the PLL circuits, with a phase of a corresponding clock signal from among a plurality of clock signals that are input to the respective PLL circuits,
   wherein the at least one logic circuit is a plurality of logic circuits, each logic circuit being configured to operate according to a corresponding output signal from among the output signals, and
   wherein the control circuit is configured to output the control signal based on a presence or absence of each of the clock signals that is input to a corresponding PLL circuit from among the PLL circuits; or one or more clock modes for the respective clock signals that are input to the PLL circuits.

5. The electronic circuit according to claim 4, wherein the control circuit is configured to output the control signal in accordance with load variation that is estimated based on the presence or absence of each of the clock signals; or the clock modes for the respective input clock signals.

6. The electronic circuit according to claim 5, wherein the control circuit is configured to:
   derive data corresponding to a magnitude of the load variation that is estimated based on the presence or absence of each of the clock signals; or the clock modes, and
   output the control signal in accordance with the derived data.

7. The electronic circuit according to claim 6, wherein the derived data is power consumption data.

8. The electronic circuit according to claim 6, wherein the control circuit is configured to output the control signal upon detecting that the derived data is greater than a threshold.

9. The electronic circuit according to claim 8, wherein the control circuit is configured to set the threshold to a target value corresponding to a setting signal that is externally supplied.

10. The electronic circuit according to claim 8, wherein the control circuit is configured not to output the control signal upon detecting that the derived data is less than or equal to the threshold.

11. The electronic circuit according to claim 4, wherein, based on a target signal that is externally supplied, the control circuit is configured to change one or more input patterns each input pattern representing the presence or absence of each of the clock signals that is input to a corresponding PLL circuit from among the PLL circuits, with respect to whether the control signal is output, the control signal being output upon detection of the one or more input patterns.

12. A control system comprising:
   a DC-DC converter; and an electronic circuit to which DC power is supplied, by the DC-DC converter, wherein the electronic circuit includes:
- at least one phase-locked loop (PLL) circuit configured to synchronize a phase of an output signal of the PLL circuit with a phase of a clock signal;
- at least one logic circuit configured to operate according to the output signal; and
- a control circuit configured to output a control signal for switching an operation mode of the DC-DC converter from a pulse frequency modulation (PFM) mode to a pulse width modulation (PWM) mode, upon detecting that the clock signal is input to the PLL circuit.

13. The control system according to claim 12, wherein, after the control signal is output from the control circuit, the electronic circuit is configured to wait for a period of lock-up time of the PLL circuit to pass, to shift from a first state to a second state in which consumption of power for the electronic circuit is higher than consumption of power in the first state.

14. The control system according to claim 12, further comprising a control unit; and
- at least one clock generator configured to supply the clock signal to the electronic circuit, in accordance with a control state of the control unit.

15. A method for controlling an electronic circuit to which DC power is supplied, by a DC-DC converter, the electronic circuit including at least one phase-locked loop (PLL circuit configured to synchronize a phase of an output signal of the PLL circuit with a phase of a clock signal; and at least one logic circuit configured to operate according to the output signal, the method comprising:
- detecting that the clock signal is input to the PLL circuit; and
- outputting a control signal for switching an operation mode of the DC-DC converter from a pulse frequency modulation (PFM) mode to a pulse width modulation (PWM) mode, upon detecting the input clock signal.

* * * * *